United States Patent
Rios et al.

(10) Patent No.: US 10,878,889 B2
(45) Date of Patent: Dec. 29, 2020

(54) HIGH RETENTION TIME MEMORY ELEMENT WITH DUAL GATE DEVICES

(71) Applicant: Intel Corporation, Santa Clara, CA (US)

(72) Inventors: Rafael Rios, Austin, TX (US); Gilbert Dewey, Hillsboro, OR (US); Van H. Le, Portland, OR (US); Jack Kavalieros, Portland, OR (US); Mesut Meterelliyoz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 15/776,058

(22) PCT Filed: Dec. 23, 2015

(86) PCT No.: PCT/US2015/000322
§ 371 (c)(1),
(2) Date: May 14, 2018

(87) PCT Pub. No.: WO2017/111798
PCT Pub. Date: Jun. 29, 2017

(65) Prior Publication Data
US 2020/0066326 A1    Feb. 27, 2020

(51) Int. Cl.
*H01L 27/108*    (2006.01)
*G11C 11/4097*    (2006.01)
*G11C 11/405*    (2006.01)

(52) U.S. Cl.
CPC ........ *G11C 11/4097* (2013.01); *G11C 11/405* (2013.01); *H01L 27/10894* (2013.01); *G11C 2211/4068* (2013.01)

(58) Field of Classification Search
None
See application file for complete search history.

(56) References Cited

U.S. PATENT DOCUMENTS 5,675,547 A  * 10/1997  Koga .................... G11C 11/005
                                                                    365/149
5,757,693 A      5/1998  Houghton et al.
(Continued)

OTHER PUBLICATIONS

International Search Report and Written Opinion for International Patent Application No. PCT/US2015/000322 dated Aug. 24, 2016, 12 pgs.

(Continued)

*Primary Examiner* — Ryan Bertram
*Assistant Examiner* — Trang K Ta
(74) *Attorney, Agent, or Firm* — Schwabe, Williamson & Wyatt, P.C.

(57) ABSTRACT

A high retention time memory element is described that has dual gate devices. A memory element has a write transistor with a gate having a source coupled to a write bit line, a gate coupled to a write line, and a drain coupled to a storage node, wherein a value is written to the storage node by enabling the gate and applying the value to the bit line, and a read transistor having a source coupled to a read line, a gate coupled to the storage node, and a drain coupled to a read bit line, wherein the value of the storage node is sensed by applying a current to the source and reading the sense line to determine a status of the gate.

20 Claims, 8 Drawing Sheets

(56) References Cited

U.S. PATENT DOCUMENTS

| | | | |
|---|---|---|---|
| 6,747,890 B1* | 6/2004 | Kirihata | H01L 27/108 257/E21.646 |
| 7,221,580 B1 | 5/2007 | Penchuk | |
| 2005/0146921 A1* | 7/2005 | Ye | G11C 11/405 365/149 |
| 2006/0028859 A1 | 2/2006 | Forbes | |
| 2007/0047293 A1* | 3/2007 | Mandelman | H01L 27/108 365/149 |
| 2015/0162913 A1* | 6/2015 | Genoe | H03K 19/1776 326/41 |
| 2017/0040041 A1* | 2/2017 | Song | G11C 5/147 |
| 2018/0061836 A1* | 3/2018 | Mathew | H01L 27/10864 |

OTHER PUBLICATIONS

International Preliminary Report on Patentability for PCT Patent Application No. PCT/US2015/000322 dated Jul. 5, 2018, 9 pgs.

* cited by examiner

HIGH RETENTION TIME MEMORY ELEMENT WITH DUAL GATE DEVICES

CROSS-REFERENCE TO RELATED APPLICATION

This patent application is a U.S. National Phase Application under 35 U.S.C. § 371 of International Application No. PCT/US2015/000322, filed Dec. 23, 2015, entitled "HIGH RETENTION TIME MEMORY ELEMENT WITH DUAL GATE DEVICES," which designates the United States of America, the entire disclosure of which is hereby incorporated by reference in its entirety and for all purposes.

FIELD

The present description relates to a transistor element and in particular a transistor suitable for use as a memory.

BACKGROUND

In the drive to make computers faster, smaller, and use less power, every component is considered. As processors become faster, memories are improved to keep up. Improvements may be for faster read and write times with lower power consumption and at lower cost. Lower cost usually comes from reducing the number of elements in a circuit but may also come from making the same element simpler or smaller.

Flash memory is growing very popular for mass storage on the order of Terabytes. Flash requires very little power except when deleting but compared to a processor, it is very slow. For operations closer to the processor, the dominant memory types are DRAM (Dynamic Random Access Memory) and SRAM (Static Random Access Memory).

Most DRAM memory cells are referred to as 1T-1C (One-transistor one-capacitor) type. These cells require a periodic refresh voltage to charge the capacitor and maintain the stored state of the cell. In addition, the stored charge drives the sensing element, so that some charge is lost from the capacitor when the cell is read. As a result, DRAM requires more power than flash memory but is much faster. SRAM is even faster than DRAM but more expensive to make due to its complexity.

Two transistor memory cells, also referred to as 2T or gain cells, are used in some high speed memory applications. In a 2T cell the gate capacitance of one of the transistors is used as the storage element. This provides a very fast and simple memory cell. The retention time is limited by leakage in the off state. The charge on the cell is refreshed before the stored gate capacitance goes too low to provide a reliable write output.

BRIEF DESCRIPTION OF THE DRAWING FIGURES

Embodiments are illustrated by way of example, and not by way of limitation, in the figures of the accompanying drawings in which like reference numerals refer to similar elements.

DETAILED DESCRIPTION

A two-transistor (2T) memory element is described herein. In some embodiments, it is designed for a high retention time. The cell takes advantage of a dual-gate thin film transistor (TFT) that can be set to a low leakage state and achieve high retention times. The memory element also charges the gate of a sensing transistor. The charged sensing transistor provides two important advantages over a storage capacitor. First the charge on the stored node is not depleted during the read operations as it is on 1T-1C DRAMs. Second, the current of the sensing device is modulated by several orders of magnitude between states providing large read margins.

The described 2T element may be formed in a very small planar space by using vertical integrated TFT techniques to minimize area and to achieve high memory densities. As described herein a dual-gate device may be formed with independent gate control that can be set to a high threshold voltage (Vt) and a very low leakage state when retaining charge. The device may also be set to a low threshold voltage (Vt) and higher performance when charging the stored node. The high threshold voltage may be set based on leakage considerations, while the low threshold voltage may be set based on write/read performance considerations. This is done in part by storing the memory state information as charge on the gate of a sensing transistor rather than storing the charge on a large area capacitor.

A standard 1T-1C (one transistor, one capacitor) DRAM cell requires a deep trench large area capacitor to increase the stored charge. Because the capacitor is subject to leakage current and because charge is lost each time the memory cell state is read, the DRAM cell requires a relatively large charge storage capacitor. Nevertheless, the storage cell has a charge refresh cycle. The larger the storage capacity the longer the interval between refreshes. Some of the charge is consumed during read operations, increasing the need for shorter refresh times.

In order to reduce the refresh cycles, the charge on the sensing transistor gate of the 2T memory is used to set its threshold voltage. As a result, the read operation does not disturb the charge stored in the memory. In addition, an ultra-low leakage programming dual-gate transistor may be used to provide longer retention times and therefore slower refresh rates. Moreover, the current in the sensing transistor varies by orders of magnitude between a "0" state and a "1" state, providing wide read margins. This provides higher accuracy for read operations.

Figure 1:
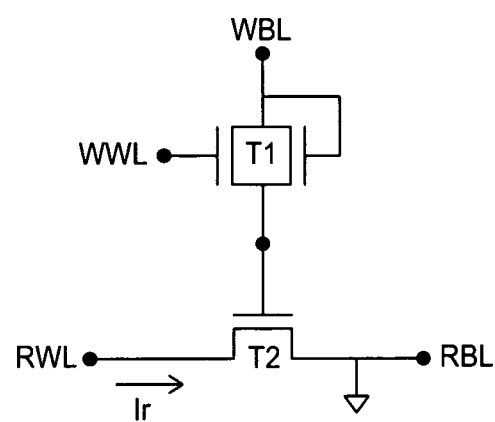
FIG. 1 is a circuit diagram of a two transistor memory cell suitable for use in a high speed memory device according to an embodiment.

FIG. 1 is a circuit diagram of a 2T memory cell suitable for use in a high speed memory device. A first transistor T1 is a dual gate device with one gate coupled to a write word line WWL and the other gate coupled to a write bit line WBL. The source is also coupled to the write bit line and the drain is coupled to a storage node S. The storage node is also coupled to the gate of a second transistor. The source of the second transistor is coupled to a read word line RWL and the drain is coupled to a read bit line RBL. The transistors are shown as CMOS (Complementary Metal Oxide Semiconductor) devices, but the invention is not so limited.

To store information in a store node S, the write word line WWL is set to high. If the word bit line WBL is high, the store node S is charged to a high voltage. On the other hand if the WBL is low, S gets discharged. In this way, the WBL determines the state that is written to the store node. Once the write operation finishes, both the WBL and the WWL are set to 0 and the first transistor T1 is in a low leakage state resulting in longer retention times for the charge stored in S.

The read operation is done by setting a low bias on the read word line RWL. If a charge is stored in S, then the second transistor T2 conducts current that can be detected in a common sensing element (not shown) coupled to RBL and shared between many cells. If no charge is stored in S, then the gate of T2 is closed and the sense current is near zero or orders of magnitude lower than when S is high.

The operation of this memory cell is greatly improved when transistor T1 is made of an ultra-low leakage, wide band-gap, metal-oxide thin film, like Indium Gallium Zinc Oxide (IGZO). An IGZO first transistor is able to provide an ultra-low off state leakage current below Wpm. This represents a significant reduction in parasitic leakage enhancing the ability to maintain the state in the storage node S. An IGZO or similar device also provides a fundamentally low leakage limit in comparison to the silicon devices that have leakage limitations due to a smaller band-gap. The first transistor T1 can be further improved using a thick gate oxide. The memory element is further improved by designing the sense transistor T2 with a very low gate leakage. T2 may be another IGZO device or a standard Si device, but made with thick gate insulators designed for very low gate leakage.

As can be seen in the circuit diagram, the read operation from the drain on the second transistor is powered by the word read line and does not significantly affect the charge at the storage node S. As a result the storage node may be made much smaller in size. There is also no need for a separate capacitor which may require more cell areas and process complexity. On the other hand there are separate word and bit lines for read and write. For an array with thousands or millions of cells the additional line increases the complexity of the overall die. On the other hand, the separate read and write access may be used to increase the bandwidth of a memory array.

Figure 2:
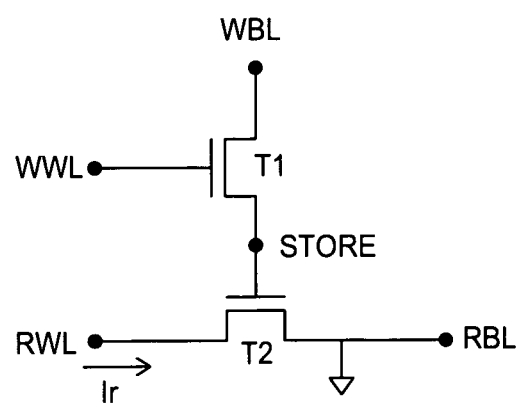
FIG. 2 is a circuit diagram of an alternative two transistor memory cell suitable for use in a high speed memory device according to an embodiment.

FIG. 2 is an alternative configuration of a 2T memory, in which the first transistor T1 has a single gate. In this example, the write bit line WBL is connected only to the source of the first transistor and not to a gate. This memory circuit benefits greatly when T1 is an ultra-low leakage device. This maintains the charge state and reduces refresh cycles.

The off state leakage may be reduced in different ways. As mentioned above, one technique is to use an IGZO (Indium Gallium Zinc Oxide) transistor structure. IGZO transistors, when designed and operated correctly, may have very low leakage. Other low leakage transistor designs, including other metal gate transistor structures, may also be used, including unconventional transistor structures with thicker or isolated gate structures. Another technique is to construct the transistor with a very high gate threshold voltage. Another technique is to construct the system so that the applied word write voltage is very low during the retention times. A zero or even a negative voltage will help to prevent charge from leaking from the storage node through the gate. These techniques may be combined to reduce the leakage still more.

Figure 3:
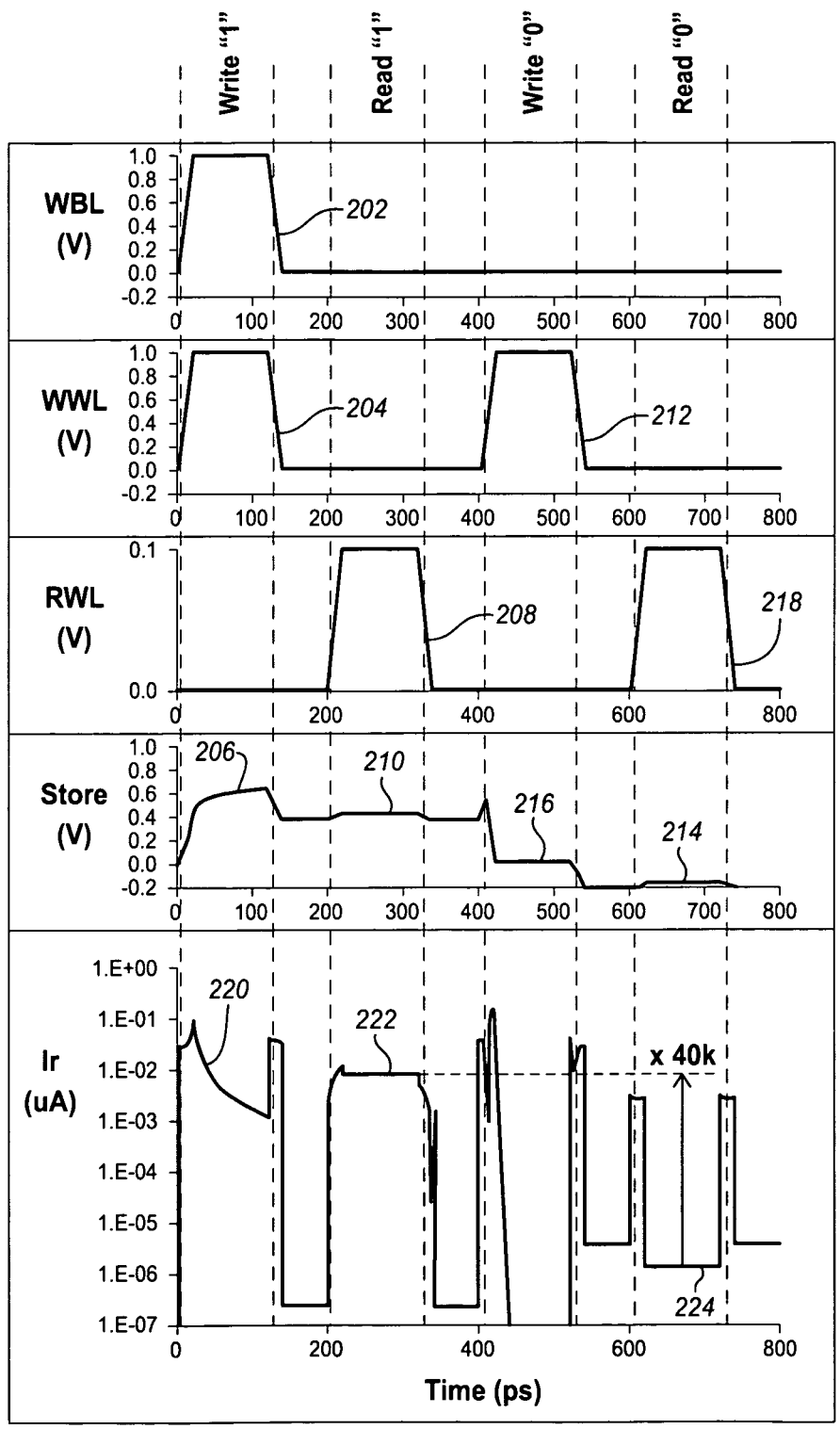
FIG. 3 is a set of waveform graphs for the circuit of FIG. 2 according to an embodiment.

FIG. 3 is a set of time aligned waveform graphs from read and write cycles of the 2T memory of FIG. 2 formed using IGZO transistors for both transistors. The results show that the sense current between read "1" and read "0" varies by over four orders of magnitude, providing a wide read margin. It is also noted that the bias on the read word line RWL doesn't need to be set high, since the margin comes from the exponential current response to the charge stored in S. To illustrate this, the simulations were done with 0.1V on the WR. Moreover, because the devices are scaled, the gate capacitance of T2 is relatively small and the programming time is fast. The combination of low capacitance, fast write/read cycles, low bias on the RWL line, and longer refresh cycles add up to large savings in operating power.

In this example, the devices are scaled to a channel length of about 30 nm and a channel width of about 60 nm. In each graph, time (picoseconds) is on the horizontal axis and voltage is on the vertical axis except for the last graph in which current (μA) is on the vertical axis. Even though IGZO devices have lower drive compared to conventional Si devices, a bit line pulse 202 and write line pulse of 120 ps is more than sufficient to perform a write "1" operation at 1 volt.

These pulses cause a charge to be stored in the storage node S as shown by the rising voltage curve 206 in the storage node. The storage voltage has a steep rise corresponding to a steep increase in charge. The rise in voltage reaches an inflection point only after about 20 ps. The charge is sufficient to store a value at this first inflection point. The stored voltage rises only very slowly and stops rising when the bit line voltage stops.

The voltage at the storage node 206 is reflected in the current curve 220 at the read word line. The current rises steeply until the time of the inflection point. After which it falls off. This current curve shows that the storage node becomes close to fully charged at the time of the inflection point, after about 20 ps.

Because the storage node S is capacitively coupled to WWL, the storage node voltage 206 decreases slightly when WWL 204 is pulled down and settles to a value of about 0.4V in this example. The voltage on the storage node S can be increased further be reducing the threshold voltage of T1 of by increasing the bias voltages on WWL and WBL.

From this example it can be seen that write pulses on the order of 100 ps are sufficient to set the state of the IGZO memory cell, which is comparable to the speed of SRAMs.

For a read cycle, the write bit line WBL and the write word line WWL are set to low, and the read word line RWL is set to high. A read pulse is shown as a similar 120 ps pulse. The voltage 210 at the storage node is almost perfectly flat during the read pulse. On the other hand the current flow through the second transistor T2 goes form very low to a very high value 222. The current flow goes back down to the very low value immediately after the read pulse ends.

For a write "0" operation, the write bit line WBL remains low, and T1 is turned on with a pulse 212 on the write word line WWL. As a result the storage node voltage quickly drops to a lower value 216. This value then represents the "0" charge state. When a later read word line RWL pulse 218 is applied to the read gate, the storage node voltage is very low 214. The second transistor is effectively off and the current 224 through the read bit line terminal is much lower than when reading the "1" value 222. The vertical current scale is exponential so that the ratio between the "1" and "0" current values is as high as 40,000 in this example. Referring to the read current graph, the read pulses 222, 224 reach a steady state as fast as the ramp rate of the driving pulses, or as soon as the displacement currents through the device capacitances end.

Using IGZO and similar device types, the refresh rate may be changed from some number of milliseconds to some number of seconds or even minutes. By reducing the refresh rate by several orders of magnitude, the power consumption and the heat generation are both greatly reduced. In addition, the access efficiency of the memory is greatly improved.

Figure 4:
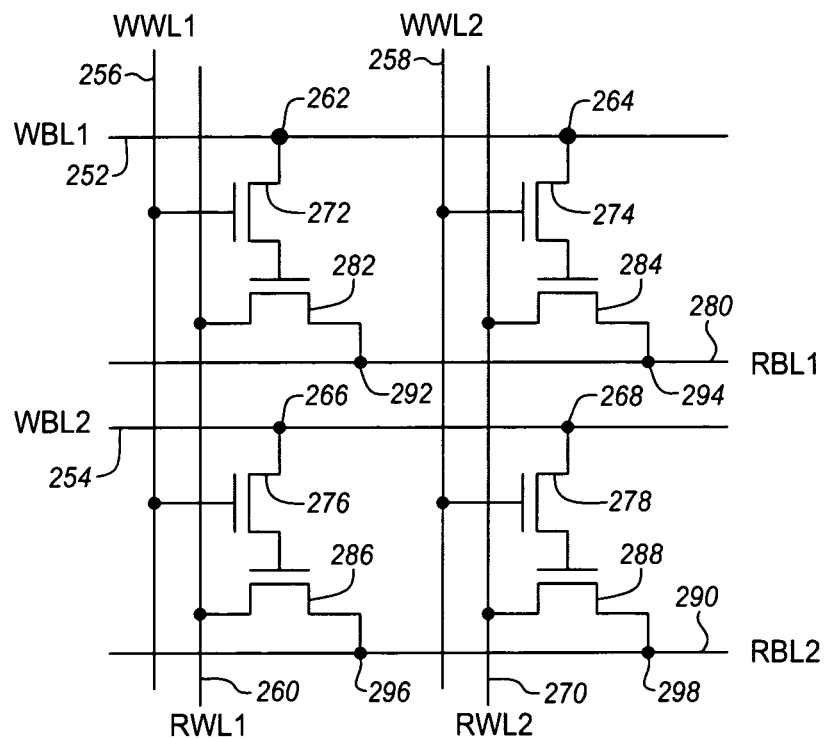
FIG. 4 is a circuit diagram of a memory array including two transistor memory cells suitable for use in a high speed memory device according to an embodiment.

FIG. 4 is a circuit diagram showing how an array of 2T memory cells may be integrated together. In this case 4 elements of the array are shown, but in working array there may be hundreds or thousands of memory cells in a block or sub-block that share word and bit lines. In this example, there are two rows and two columns with two memory cells each, however a working system will continue in both direction with many more rows and many more columns.

There is a bit line 252, 254 for each row. The bit lines are coupled to the source 262, 264, 266, 268 of the first transistor 272, 274, 276, 278 of each memory cell. Similarly, there is a write line 256, 258, for each column coupled to the gates of the first transistor of each memory cell. When a write line and a bit line for any one cell are high then a write "1" operation occurs at that cell.

For read operations, there is a word read line 260, 270 for each column coupled to the gate of the second transistors 282, 284, 286, 288 of each memory cell. Similarly a read sense line for each row coupled to the drain 292, 294, 296, 298 of each of the second transistors of each memory cell. When a word read line is enabled in a column, then the read voltage or current may be read for any one column to obtain a value for a particular memory cell. Since the read operation does not draw any charge from the storage node, the word read line may be powered many times without affecting memory states of cells in the array that are not being read.

While the shared bit, word read, word write and sense lines are shown as having a particular ordering for rows and columns, these may be switched. The bit line may be for each column and word write shared among rows. Similarly the word read line may be shared between rows and the word read line shared for columns. The writing and reading operations may be changed independently of each other.

Figure 5:
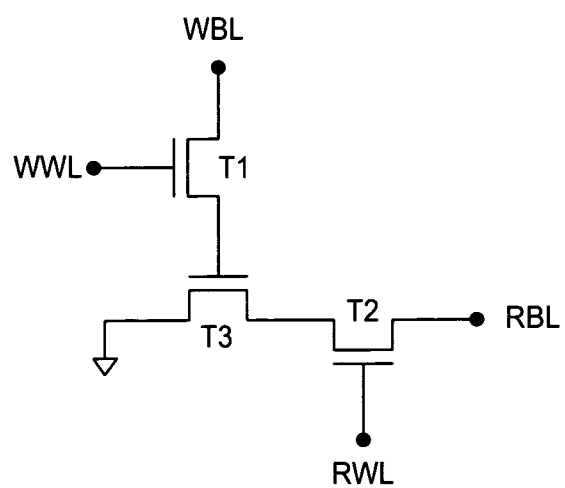
FIG. 5 is a circuit diagram of a three transistor memory cell suitable for use in a high speed memory device according to an embodiment.

FIG. 5 is a circuit diagram of an alternative three transistor (3T) memory element. The same techniques described herein for long retention and vertical formation may be applied to this and other similar memory elements. This circuit adds an additional transistor to minimize the disturbance caused by read operations. As in the examples of FIG. 1 and FIG. 2, a first transistor T1 has a source coupled to a write bit line WBL and a gate coupled to a write word line WWL. The drain is coupled to a read transistor which, identified as the second transistor T2. The read transistor has a gate coupled to a read word line RWL and a source coupled to the read bit line RBL.

An additional transistor is coupled between the write transistor T1 and the read transistor T2. This third transistor T3 has a gate coupled to the source of the write transistor T1 and the drain coupled to the source of the read transistor T2. The source is pinned to ground. The storage node resides between T1 and T2 and includes T3. Accordingly, leakage for T2 can be minimized in a similar way.

Figure 6:
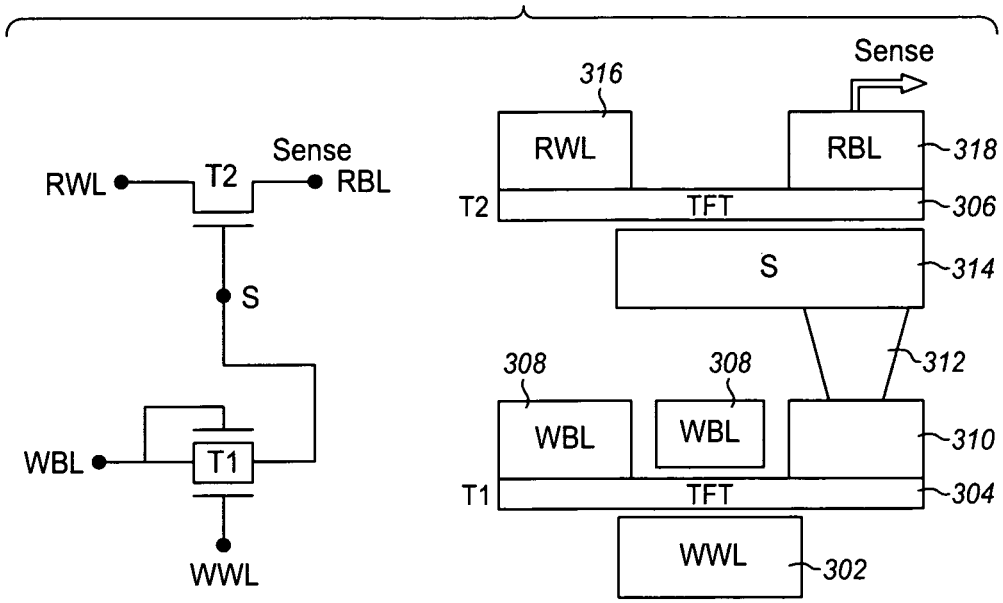
FIG. 6 is a cross-sectional side view diagram of a 2T memory cell in stacked metal layers according to an embodiment.

FIG. 6 is a cross-sectional side view diagram of a memory cell as described herein in which the transistors are arranged vertically in stacked metal layers. The structure is represented as a circuit diagram beside the metal layer structure. This structure provides 3-D vertical integration using TFT (Thin Film Transistors). The TFT may be formed of many different structural materials, such as poly-Si, poly-Ge, metal-oxide class materials such as IGZO, ZnO, and 2D class materials like transition metal dichalcogenides (TMD) and graphene. For long retention times, the structures are designed for very low leakage.

At the lowest metal layer the word write line 302 is formed. The first TFT 304 corresponding to the first transistor in FIGS. 1, 2 and 5 is formed over the word write line layer 304. This TFT includes source, drain, and gate structures and the gate is coupled to the word write line. A bit line 308 is formed over the TFT to couple to the source on the left side of the first TFT 304 as shown. The bit line is also coupled to the gate at the center of the TFT. On the other side of the TFT a contact 310 is formed over the drain. A via 312 connects the contact to a storage node area 314 formed over the first TFT. The second TFT 306 is formed over the storage node area so that the gate is connected to the storage node. A word read line 316 is formed over the source side of the second TFT 306 and the sense contact 318 is formed over the drain side of the second TFT. The sense contact is used to provide a current or voltage to be read by downstream components.

In this cross-section, each of the lines of the structure are formed in horizontal layers and may extend into and out of the plane of the page to connect with other TFTs and to power supply and sense circuitry. The TFTs may be formed as IGZO transistors or another metal gate or very low leakage transistor. The metal layers may be formed over a silicon substrate or other type of substrate. In some embodiments, the metal layers are those typically formed over the active circuitry of a silicon semiconductor die. In this way, area that is normally used only for interconnections and redistribution may also be used for a memory array. For a processor chip, a fast and long retention DRAM may be integrated on the chip using vertically integrated TFTs in the upper metal layers. This provides a very compact combined structure.

Figure 7:
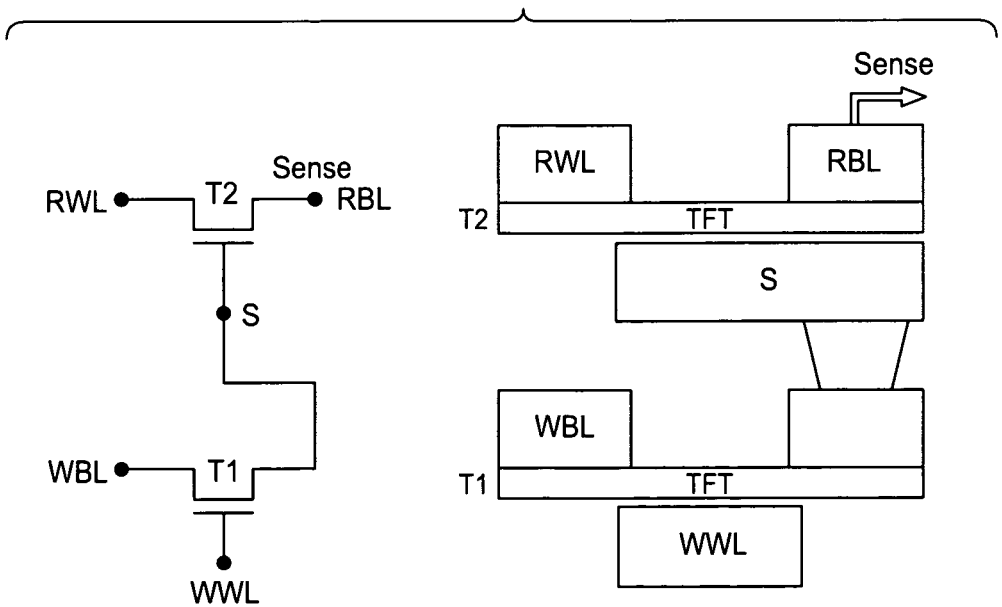
FIG. 7 is a cross-sectional side view diagram of a second 2T memory cell in stacked metal layers according to an embodiment.

FIG. 7 is a cross-sectional side view diagram of a metal layer structure corresponding to the circuit of FIG. 2. The circuit of FIG. 2 is represented in a configuration like that of the metal layer structure beside the metal layer structure. This vertical metal layer structure is almost the same as that of FIG. 6 except that WBL is not also connected to the gate of the first transistor as it is in FIG. 6. The operation and benefits of the circuit are the same as described above in the context of FIG. 2.

Figure 8:
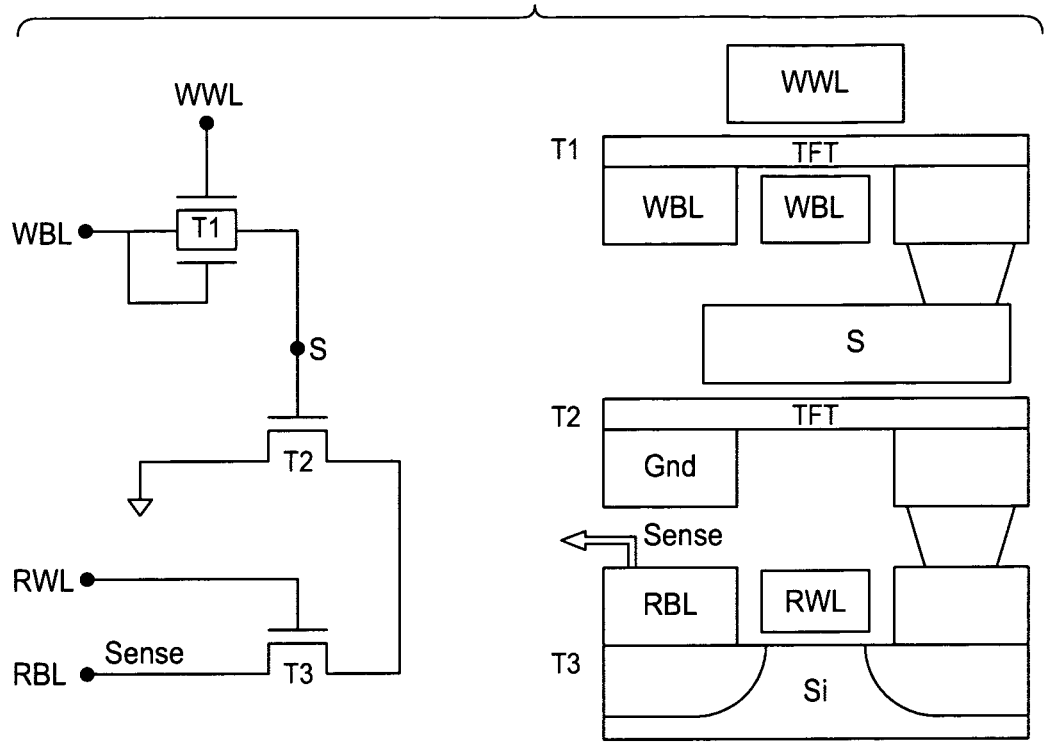
FIG. 8 is a cross-sectional side view diagram of a 3T memory cell in stacked metal layers and silicon according to an embodiment.

FIG. 8 is a cross sectional side view diagram of a metal layer structure corresponding to the circuit of FIG. 5. The operation and benefits of the circuit are the same as described above in the context of FIG. 5. While the third transistor may be formed in the metal layers like the first and second transistors, in this example, the read transistor T3 is formed in the silicon of the memory array or another underlying device. Alternatively, the third transistor may also be formed in the metal layers as in the examples above.

Figure 9:
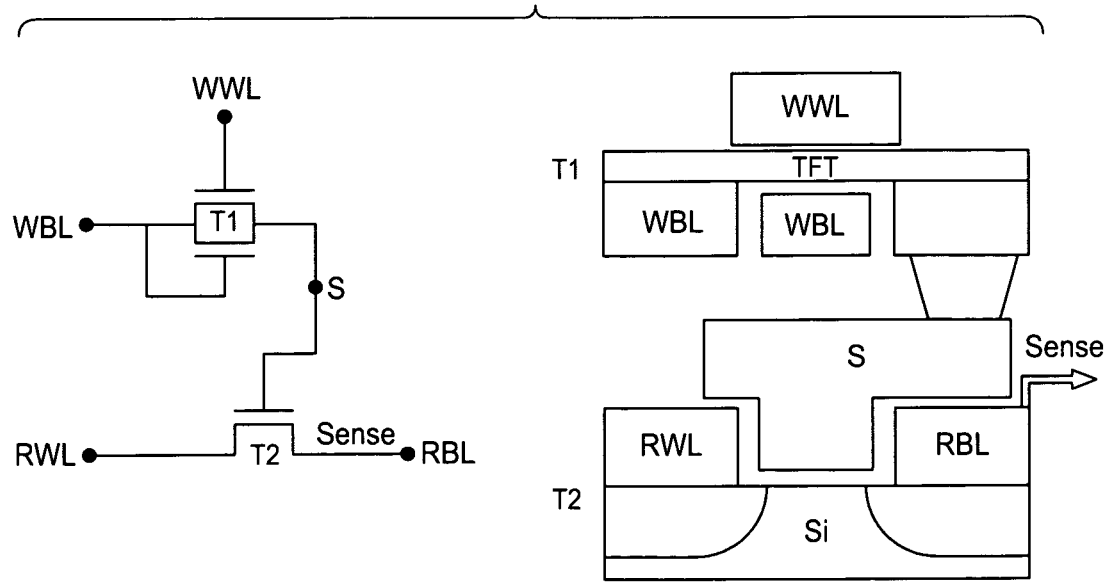
FIG. 9 is a cross-sectional side view diagram of a 2T memory cell in stacked metal layers and silicon according to an embodiment.

FIG. 9 is a cross-sectional side view diagram of an alternative structure for the circuit of FIGS. 1 and 6. In this example, the read transistor T2 is formed as a silicon device and the write transistor T1 is formed in the metal layers as, for example, an IGZO device. A similar variation may be applied to the FIGS. 2 and 7 circuit.

Figure 10:
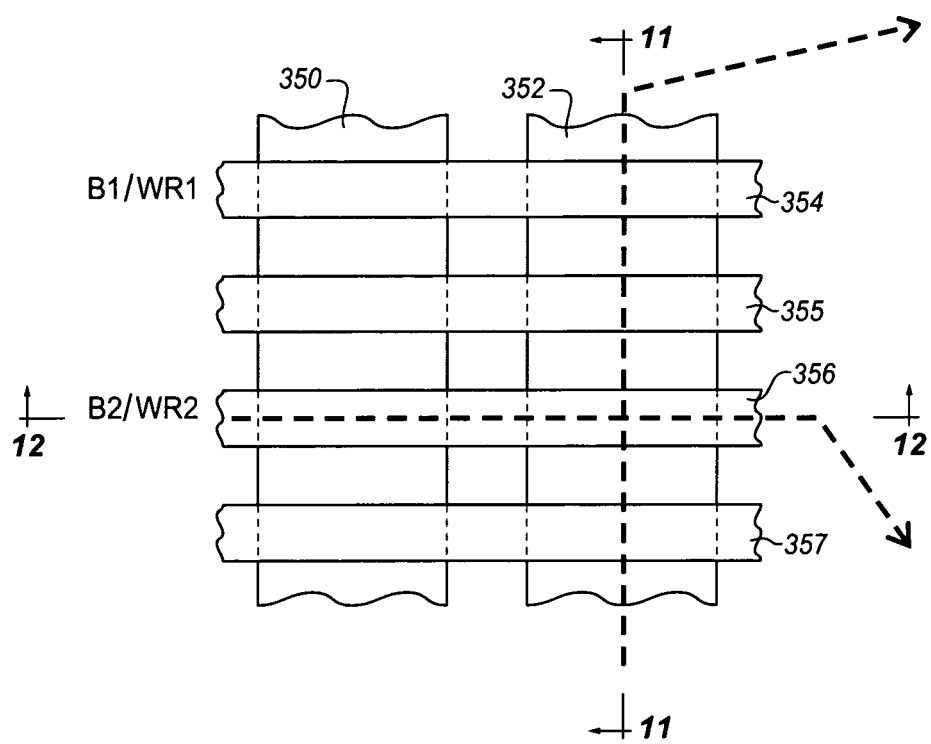
FIG. 10 is a to partially transparent view diagram of a memory cell array in stacked metal layers according to an embodiment.
Figure 12:
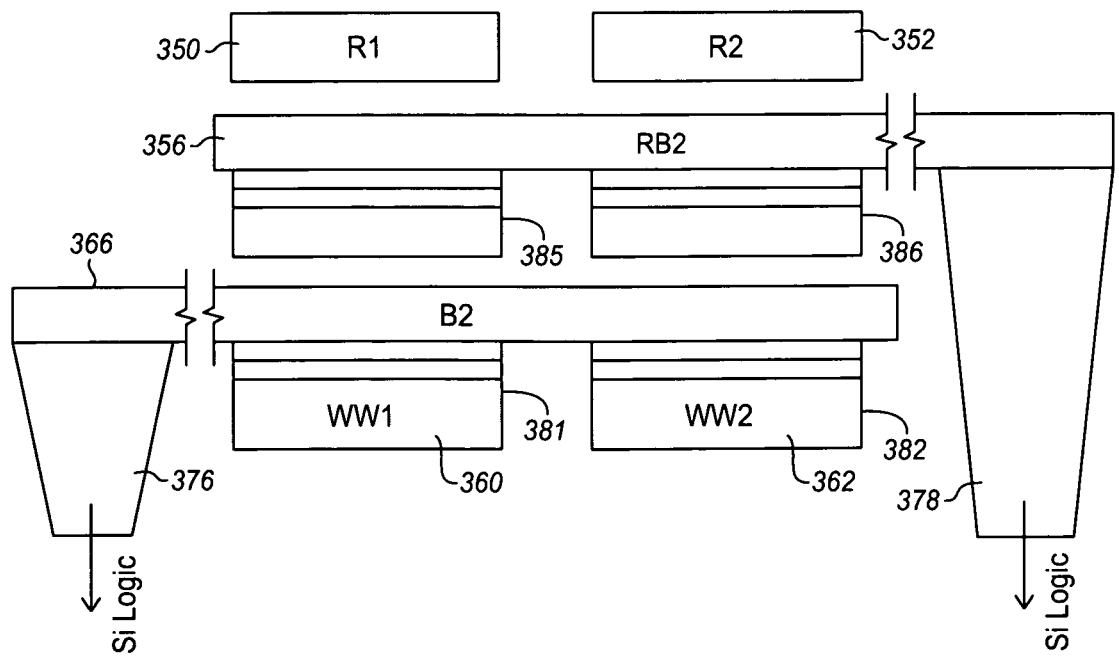
FIG. 12 is a cross-sectional rotated side view diagram of the memory cell array of FIG. 7 in stacked metal layers according to an embodiment.

FIG. 10 is a top partially transparent view diagram of some of the connection lines in the stacked metal layers of an alternative vertical structure for stacked memory elements. As shown the metal layers may be used to form lines to connect an array of memory elements together. The metal lines continue in all directions to form all of the many memory elements of the array. As shown in FIGS. 8 and 12, the stacked transistors are formed with the second read-out transistor above the first write transistor just as in FIG. 6. This order may be reversed in order to suit different wiring configurations.

On the left side of the diagram there are the word read lines (WR) 354, 356 and sense lines (R) 355, 357. There is one of each for each memory element and the diagram corresponds to four cells arranged in two rows of two each. There are bit lines (B) and drain connections below the word read lines and sense lines. In this example, they have exactly the same dimensions and so are not visible. With a real memory element, this will not be the case. Similarly, across the top are the sense lines 350, 352 of the two memory elements. The word write lines 362 are directly below and not visible in this diagram.

Figure 11:
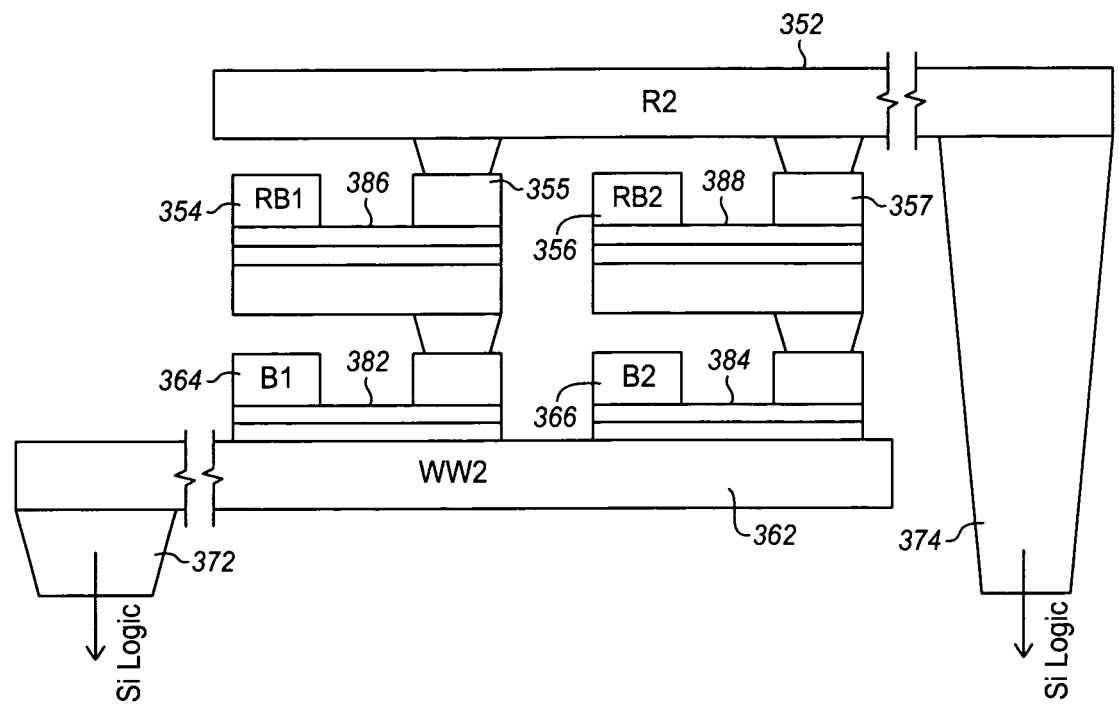
FIG. 11 is a cross-sectional side view diagram of the memory cell array of FIG. 7 in stacked metal layers according to an embodiment.

FIG. 11 is a side view diagram of the four elements of FIG. 7 taken along line 11-11 of FIG. 7. In this view the word write line 362 extends across the bottom of the metal layers horizontally in the plane of the page. A via 372 between or outside of the memory elements connects this line to logic in lower layers of the structure. Alternatively, this via may connect to logic above the structure.

The first write transistors 382, 284 of two of the memory cells are formed over the word write line. These transistors have a high-k dielectric layer over the word write line and a metal gate layer, such an IGZO layer over the dielectric. The bit lines 364, 366 are formed over the source sides of the transistors extending through the plane of the page and the sink contacts are formed over the sink sides of the transistors.

The sink contacts connect to the corresponding second or write transistor 368, 388 through a storage node area. These have the word read lines 354, 336 on the source side and the sense contacts 355, 357 on the drain side both extending through the plane of the page. The source contacts are connected to a common word read line 352 extending along the plane of the page. A via 374 connects this line to sense circuitry and data input structures in logic in another layer. The other two memory elements are behind the two shown and so are not visible in this view.

FIG. 12 is a side view diagram of the same structure taken along line 12-12 which is perpendicular to line 11-11. Accordingly the right side transistors 382, 386 are the left side transistors of FIG. 11. A previously obscured memory element is on the left side with two transistors 381, 385 similar to those of the other memory elements. The word write lines 360, 362 and the read or sense lines 350, 352 extend through the plane of the page. The bit lines 366 are connected to vias 376 that connect to logic on another layer and the word read lines 356 extend through vias 378 to logic in other layers. The structure shown in FIGS. 7-12 may be extended not only to include more memory elements in the same layers but additional layers may be used to form more memory elements as additional arrays above and below the one shown or as additional elements of a single array.

Figure 13:
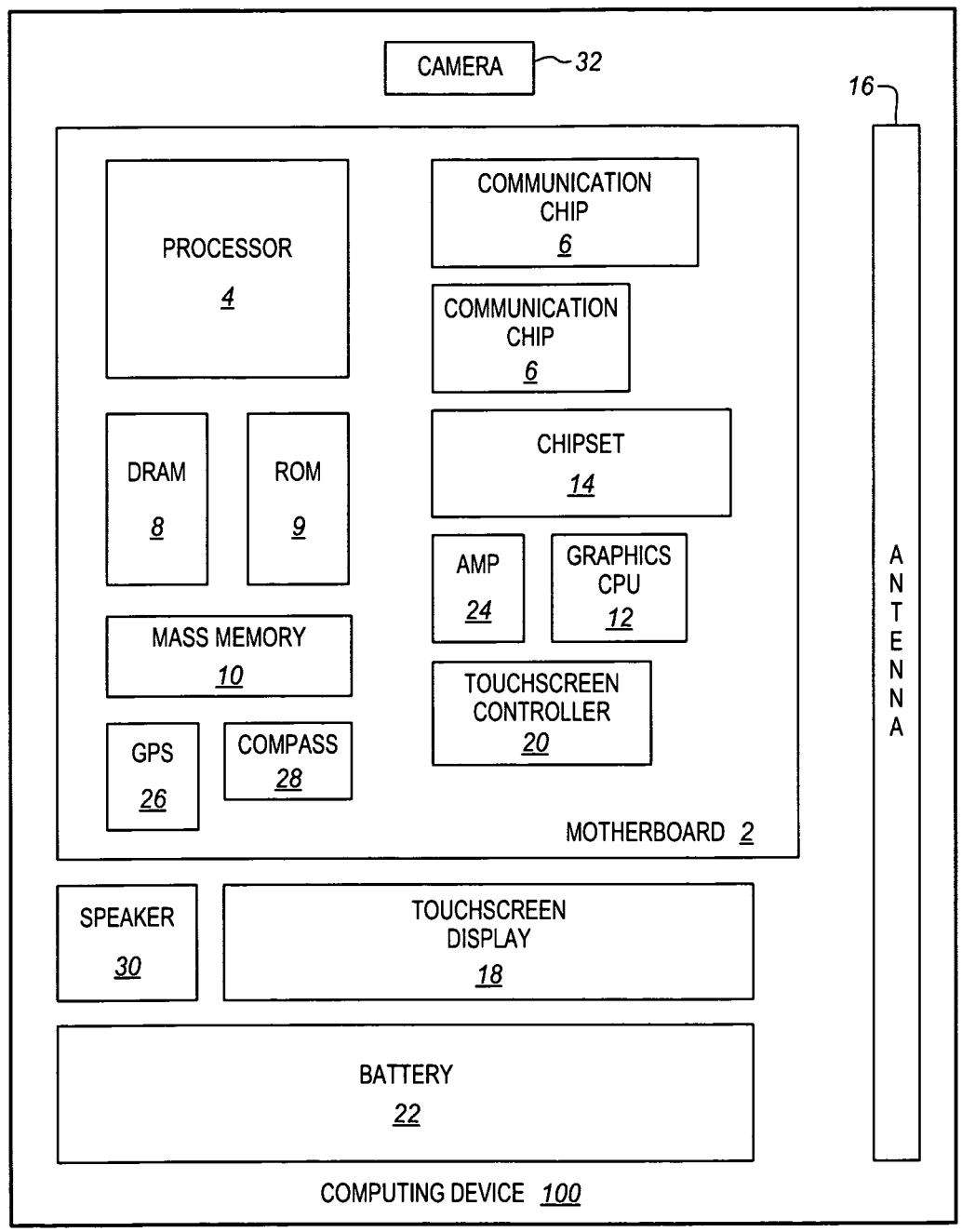
FIG. 13 is a block diagram of a computing device incorporating a tested semiconductor die according to an embodiment.

FIG. 13 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, the integrated circuit die of the processor, memory devices, communication devices, or other components are fabricated to include vertical memory elements or memory elements with low leakage transistors as described herein. One or more of the illustrated components may be combined into a processor package, system in package or system on a chip as described herein. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to memory element that includes a write transistor with a metal gate having a source coupled to a write bit line, a gate coupled to a write line, and a drain coupled to a storage node, wherein a value is written to the storage node by enabling the gate and applying the value to the bit line, and a read transistor having a source coupled to a read line, a gate coupled to the storage node, and a drain coupled to a read bit line, wherein the value of the storage node is sensed by applying a current to the source and reading the sense line to determine a status of the gate.

In further embodiments the write transistor has a gate threshold voltage that is higher than the bit line voltage.

In further embodiments the write transistor has a low off state gate leakage.

In further embodiments the write transistor is a thick gate transistor.

In further embodiments the write transistor has an Indium Gallium Zinc Oxide structure.

In further embodiments the read transistor has a low gate leakage.

In further embodiments the read transistor has a metal gate.

In further embodiments wherein the read transistor has an Indium Gallium Zinc Oxide structure.

In further embodiments the write and read transistors are stacked one over the other.

In further embodiments the write transistor is over a write bit line, the storage node is stacked over the write transistor and the read transistor is stacked over the storage node.

In further embodiments the write and read transistors are formed in metal layers of an integrated circuit die.

In further embodiments the write bit line, write line, read line, and read bit line are coupled to logic circuits of the die through vertical vias through the metal layers.

Further embodiments include a plurality of additional write transistors and wherein the write bit line and write line are coupled to the plurality of additional transistors.

Further embodiments include a third transistor between the write transistor and the read transistor, the third transistor having a gate coupled to the drain of the write transistor and a drain coupled to the source of the read transistor.

Some embodiments include a method that includes forming a word write line as a horizontal layer in a first metal layer of an integrated circuit die, forming a first metal gate thin film transistor over the write line so that the word write line is coupled to the first transistor gate, forming a write bit line in a second metal layer over the first transistor so that the write bit line is coupled to the first transistor source, forming a storage node in the second metal layer over the first transistor so that the storage node is coupled to the first transistor drain, forming second transistor over the storage node so that a gate of the second transistor is coupled to the storage node, forming a read bit line in a third metal layer over the second transistor so that the read bit line is coupled to a drain of the second transistor, and forming a read line in the third metal layer over the second transistor so that the read line is coupled to a source of the transistor.

Further embodiments include forming a first transistor comprises forming an Indium Gallium Zinc Oxide transistor.

Further embodiments include forming a vertical via from the read bit line to active circuitry of the integrated circuit die below the first transistor.

Some embodiments pertain to a computing system that includes a system board, a memory connected to the system board, and a processor coupled to the memory through the system board, the processor being formed of active circuitry on a substrate and having a plurality of metal layers over the active circuitry, the metal layers including a memory array having a plurality of memory elements each memory element including a write transistor with a low off state gate leakage having a source coupled to a write bit line, a gate coupled to a write line, and a drain coupled to a storage node, wherein a value is written to the storage node by enabling the gate and applying the value to the write bit line, and a read transistor having a source coupled to a read line, a gate coupled to the storage node, and a drain coupled to a read bit line, wherein the value of the storage node is sensed by applying a current to the source and reading the read bit line to determine a status of the gate.

In further embodiments the write bit line, write line, read line, and read bit line are coupled to logic circuits of the die through vertical vias through the metal layers.

In further embodiments the write bit line, write line, read line, and read bit line are shared among memory elements of memory array.

The invention claimed is:

1. A memory element comprising:
   a substrate;
   a write transistor with a low off state gate leakage having a source coupled to a write bit line, a gate coupled to a write line, and a drain coupled to a storage node, the storage node above the substrate, wherein the storage node is not coupled to a capacitor, wherein a value is written to the storage node by enabling the gate and applying the value to the bit line; and
   a read transistor having a source coupled to a read line, a gate, and a drain coupled to a read bit line, wherein the read transistor is above and vertically over the storage node such that the gate is connected to the storage node, and wherein the value of the storage node is sensed by applying a current to the source and reading the sense line to determine a status of the gate.

2. The memory element of claim 1, wherein the write transistor has a gate threshold voltage that is higher than the bit line voltage.

3. The memory element of claim 1, wherein the write transistor has a metal gate.

4. The memory element of claim 1, wherein the write transistor is a thick gate transistor.

5. The memory element of claim 1, wherein the write transistor has an Indium Gallium Zinc Oxide structure.

6. The memory element of claim 1, wherein the read transistor has a low gate leakage.

7. The memory element of claim 1, wherein the read transistor has a metal gate.

8. The memory element of claim 1, wherein the read transistor has an Indium Gallium Zinc Oxide structure.

9. The memory element of claim 1, wherein the write and read transistors are stacked one over the other.

10. The memory element of claim 9, wherein the write transistor is over a write word line, the storage node is stacked over the write transistor and the read transistor is stacked over the storage node.

11. The memory element of claim 9, wherein the write and read transistors are formed in metal layers of an integrated circuit die.

12. The memory element of claim 11, wherein the write bit line, write line, read line, and read bit line are coupled to logic circuits of the die through vertical vias through the metal layers.

13. The memory element of claim 1, further comprising a plurality of additional write transistors and wherein the write bit line and write line are coupled to the plurality of additional transistors.

14. The memory element of claim 1, further comprising a third transistor between the write transistor and the read transistor, the third transistor having a gate coupled to the drain of the write transistor and a drain coupled to the source of the read transistor.

15. A method comprising:
   forming a word write line as a horizontal layer in a first metal layer of an integrated circuit die;
   forming a first metal gate thin film transistor over the write line so that the word write line is coupled to the first transistor gate;
   forming a write bit line in a second metal layer over the first transistor so that the write bit line is coupled to the first transistor source;
   forming a storage node in the second metal layer over the first transistor so that the storage node is coupled to the first transistor drain;
   forming second transistor over the storage node so that a gate of the second transistor is coupled to the storage node, wherein the storage node is not coupled to a capacitor;
   forming a read bit line in a third metal layer over the second transistor so that the read bit line is coupled to a drain of the second transistor; and
   forming a read line in the third metal layer over the second transistor so that the read line is coupled to a source of the transistor.

16. The method of claim 15, wherein forming a first transistor comprises forming an Indium Gallium Zinc Oxide transistor.

17. The method of claim 15, further comprising forming a vertical via from the read bit line to active circuitry of the integrated circuit die below the first transistor.

18. A computing system comprising:
   a system board;
   a memory connected to the system board; and
   a processor coupled to the memory through the system board, the processor being formed of active circuitry on a substrate and having a plurality of metal layers over the active circuitry, the metal layers including a memory array having a plurality of memory elements each memory element including a substrate, a write transistor with a low off state gate leakage having a source coupled to a write bit line, a gate coupled to a write line, and a drain coupled to a storage node, the storage node above the substrate, wherein the storage node is not coupled to a capacitor, wherein a value is written to the storage node by enabling the gate and applying the value to the write bit line, and a read transistor having a source coupled to a read line, a gate, and a drain coupled to a read bit line, wherein the read transistor is above and vertically over the storage node such that the gate is connected to the storage node, and wherein the value of the storage node is sensed by applying a current to the source and reading the read bit line to determine a status of the gate.

19. The computing system of claim 18, wherein the write bit line, write line, read line, and read bit line are coupled to logic circuits of the die through vertical vias through the metal layers.

20. The computing system of claim 18, wherein the write bit line, write line, read line, and read bit line are shared among memory elements of memory array.

* * * * *